United States Patent
Pilz et al.

(10) Patent No.: US 10,520,826 B2
(45) Date of Patent: Dec. 31, 2019

(54) OPTICAL ELEMENT, OPTICAL ASSEMBLY AND PRODUCTION METHOD

(71) Applicant: Carl Zeiss SMT GmbH, Oberkochen (DE)

(72) Inventors: Roland Pilz, Aalen (DE); Thomas Petasch, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/223,624

(22) Filed: Dec. 18, 2018

(65) Prior Publication Data

US 2019/0121240 A1    Apr. 25, 2019

Related U.S. Application Data

(60) Division of application No. 15/604,977, filed on May 25, 2017, now Pat. No. 10,175,582, which is a
(Continued)

(30) Foreign Application Priority Data

Dec. 3, 2014    (DE) .................. 10 2014 224 717

(51) Int. Cl.
*G03F 7/20* (2006.01)
*G02B 21/33* (2006.01)
(Continued)

(52) U.S. Cl.
CPC ............. *G03F 7/7015* (2013.01); *G02B 1/14* (2015.01); *G02B 1/18* (2015.01); *G02B 7/028* (2013.01);
(Continued)

(58) Field of Classification Search
CPC .............. G03F 7/7015; G03F 7/70916; G03F 7/70341; G02B 1/14
(Continued)

(56) References Cited

U.S. PATENT DOCUMENTS 8,279,402 B2 * 10/2012 Six ...................... G03F 7/70341
355/67
9,158,207 B2   10/2015 Weippert
(Continued)

FOREIGN PATENT DOCUMENTS

DE    10 2011 080 639 A1    10/2012
DE    10 2011 088 623 A1    1/2013
(Continued)

OTHER PUBLICATIONS

International Search Report for corresponding Appl No. PCT/EP2015/077796, dated Apr. 15, 2016.
(Continued)

*Primary Examiner* — Hung Nguyen
(74) *Attorney, Agent, or Firm* — Fish & Richardson P.C.

(57) ABSTRACT

An optical element for transmitting radiation includes: a first surface region surrounding an optically used area of the optical element; and a second surface region that adjoins the first surface region. A circumferential edge is formed between the first and second surface regions. The optical element further includes a one-piece film which covers the first surface region, the edge and the second surface region. The film includes a hydrophobic material at least on its side facing away from the first and the second surface regions. An optical assembly includes at least one such optical element. A method produces such an optical element.

21 Claims, 3 Drawing Sheets

Related U.S. Application Data continuation of application No. PCT/EP2015/077796, filed on Nov. 26, 2015.

(51) Int. Cl.
  *G02B 27/00* (2006.01)
  *G02B 1/14* (2015.01)
  *G02B 1/18* (2015.01)
  *G02B 7/02* (2006.01)

(52) U.S. Cl.
  CPC ......... *G02B 21/33* (2013.01); *G02B 27/0006* (2013.01); *G03F 7/70316* (2013.01); *G03F 7/70341* (2013.01); *G03F 7/70916* (2013.01)

(58) Field of Classification Search
  USPC .............................................. 355/30, 53, 77
  See application file for complete search history.

(56) References Cited

U.S. PATENT DOCUMENTS

| | | |
|---|---|---|
| 2008/0316441 A1 | 12/2008 | Liebregts |
| 2009/0135385 A1 | 5/2009 | Gellrich et al. |
| 2010/0066987 A1 | 3/2010 | Bruijstens et al. |
| 2017/0261860 A1 | 9/2017 | Pilz et al. |

FOREIGN PATENT DOCUMENTS

| | | |
|---|---|---|
| DE | 10 2014 224 735 A1 | 7/2015 |
| WO | WO 2008/031576 A1 | 3/2008 |

OTHER PUBLICATIONS

International Preliminary Report on Patentability, with translation thereof, for corresponding Appl No. PCT/EP2015/077796, dated Jun. 15, 2017.

\* cited by examiner

OPTICAL ELEMENT, OPTICAL ASSEMBLY AND PRODUCTION METHOD

CROSS-REFERENCE TO RELATED APPLICATIONS

The present application is a divisional of, and claims benefit under 35 USC 120 to, U.S. application Ser. No. 15/604,977, filed May 25, 2017, which is a continuation of, and claims benefit under 35 USC 120 to, international application PCT/EP2015/077796, filed Nov. 26, 2015, which claims benefit under 35 USC 119 of German Application No. 10 2014 224 717.9, filed Dec. 3, 2014. The entire disclosure of these applications are incorporated by reference herein.

FIELD

The disclosure relates to an optical element for the transmission of radiation, which includes a first surface region, which surrounds an optically used region of the optical element, and a second surface region, which adjoins the first surface region, a peripheral edge being formed between the first surface region and the second surface region. The disclosure also relates to an optical assembly with such an optical element and to a method for producing such an optical element.

BACKGROUND

The wetting of the surfaces of optical elements with liquids, in particular water, generally has adverse effects on their optical properties. For example, wetting may cause contaminating substances such as salts to form on their surfaces. This a relevant issue in particular in immersion lithography, in which an immersion fluid is introduced between a last optical element of a projection lens and a light-sensitive substrate.

It is known that the wetting of an optical element outside an optically used region or diameter at which the optical element is immersed into the immersion fluid can have adverse effects on its optical properties: If the wetting liquid evaporates on a surface outside the optically used surface region, cold of evaporation is produced. Therefore, a heat sink that has an adverse effect on the thermal equilibrium of the optical element may form in the wetted region. For example, in the case of optical elements in the form of lenses, the refractive index of the material used as the main body may change locally as a result, which can lead to imaging errors.

In order to avoid wetting of optical elements with water or to remove water quickly from them, it is known to provide optical elements with hydrophobic coatings. For example, WO 2008/031576 A1 describes an optical element of a material that is transparent to wavelengths in the UV range, to which a hydrophobic coating has been applied. The hydrophobic coating is formed outside the optically free diameter, or outside the optically used region, of the optical element and has at least one layer that is UV-resistant and preferably absorbent to UV radiation at a wavelength of less than 260 nm. The optical element may be formed as a plano-convex lens, on the planar surface of which there is formed a conically shaped lens part. The hydrophobic coating may be formed on the conical lateral surface of the conically shaped lens part and/or on the plane surface.

It has been found that the liquid-repellent properties of a hydrophobic coating may decrease during the service life of the optical element (generally several years), for example as a result of contaminants deposited there and/or due to the long-term exposure to UV radiation.

SUMMARY

The disclosure seeks to provide an optical element, an optical assembly with at least one such optical element and a method for producing an optical element with which the influence of the wetting with a liquid, in particular with water, on the optical properties of the optical element can be reduced.

In one aspect, the disclosure provides an optical element that has a one-piece film covering a first surface region, an edge and a second surface region. The film includes or is formed from a hydrophobic material at least on its side facing away from the first and second surface regions. In particular, the film may include a hydrophobic material or consist of a hydrophobic material altogether, i.e. not only on its side facing away from the first and second surface regions.

According to the disclosure, it is proposed to apply a film that has hydrophobic properties to the optical element instead of a hydrophobic coating. Here, the film covers both the first surface region, which is typically at least partially immersed into the immersion fluid, and the second surface region and the edge formed between these surface regions. In the regions that are covered by the film, the wetting with a liquid, in particular with water, is counteracted as a result of the hydrophobic properties of the film. The film is typically connected at least to the first surface region and to the second surface region of the optical element, for example by adhesive bonding, and consequently also covers the peripheral edge between the two surface regions.

If the hydrophobic material of the film loses its liquid-repellent properties during the service life of the optical element, the film can be removed from the optical element and replaced with a new film without this requiring that the optical element has to be removed from the optical assembly in which it is integrated. By contrast, to replace a degraded hydrophobic coating, the optical element is first removed from the optical assembly, for example a projection exposure apparatus, and re-coated in a coating installation, which would involve considerable effort.

In an advantageous embodiment, the film is preformed and preferably has a transition in the form of a bend or a curved portion in the region of the peripheral edge. In order to avoid wetting of the optical element at the transition between the first surface region and the second surface region at which the peripheral edge is formed, it is advantageous if a continuous or one-piece film that also covers the edge is used. In the case of a non-preformed one-piece film, there is typically the problem that it cannot be positioned precisely enough on the optical element, to be more precise on the first and second surface regions, without the inclusion of air bubbles, which can have disadvantageous effects on the thermal characteristics of the optical element.

In order to apply the film to the first and second surface regions as far as possible without the inclusion of air bubbles, a preformed film which has a three-dimensional geometry that is adapted to the geometry of the optical element, to be more precise to the geometry of the first and second surface regions and the transition in the region of the edge, is preferably used. For this purpose, the preformed film typically has a first, for example conical, film portion for the connection to the first surface region and a second, for example plane, film portion for the connection to the second surface region. If appropriate, the film may extend further outward over the second surface region of the optical element, in order to cover at least partially components that are present there. In this case, the film may possibly have in a portion projecting over the second surface region a geometry adapted to the component to be covered and/or an adapted cutout shape.

The two film portions of the preformed film are typically aligned in relation to one another at an angle that coincides substantially with the included angle that the two surface regions of the optical element form with one another at the edge. In this way, an exact fit of the preformed film on the optical element can be produced. Formed between the two film portions is a transition in the form of a curved portion or a bend, which generally connects the two film portions to one another continuously. The transition may be formed as a bend with a (small) radius of curvature of for example 2 mm or less. If appropriate, the transition may also be formed discontinuously, i.e. as a bend or as a curved portion in the form of a kink in the film. The preformed transition between the two film portions, and consequently the three-dimensional form of the film, may be produced for example by embossing or by thermoforming a film with for example a plane geometry. Alternatively, the entire film with its three-dimensional geometry may be built up layer by layer, for example via a 3D printer or the like. The deformation, in particular in the region of the transition between the film portions, can also be seen after the attachment of the film to the optical element, or after the possibly desired detachment of the film from the optical element.

In an advantageous embodiment, the film is connected to the first surface region and to the second surface region of the optical element by at least one adhesive layer. The adhesive layer preferably connects the film to the first and second surface regions over a surface area or areas. It may be desired to pretreat the hydrophobic material of the film or the film itself in order to increase the adhesion to the adhesive layer. For this purpose, the hydrophobic material of the film may be subjected to a surface treatment, for example an etching process, a plasma treatment and/or a machining operation.

In one development, the adhesive layer has a first adhesive layer portion for the connection of the film to the first surface region and/or a second adhesive layer portion for the connection of the film to the second surface region. On account of the connection over a surface area or areas in the first and/or second surface region, it is not absolutely necessary that the adhesive layer is also attached in the region of the edge or the kink, i.e. this region may be left.

In particular if the film itself is formed as a heat-conducting component, it is possibly sufficient only to connect the film at the second adhesive layer portion to the second surface region or to use a continuous adhesive layer that only partially extends into the first surface region. In this case, the immersion fluid may penetrate into the region between the film and the optical element that is not covered by the adhesive layer. The heat-conducting properties of the film allow the temperature of the immersion fluid to be largely homogenized in this region, so that the penetration of the immersion fluid has virtually no effects on the optical properties of the optical element.

The adhesive layer is preferably formed by a (double-sided) adhesive tape. Such adhesive tapes are available with a comparatively small thickness of for example about 50 μm. In particular, the first adhesive layer portion may be formed by a first portion of a first double-sided adhesive tape and the second adhesive layer portion may be formed by a second portion of a double-sided adhesive tape, which are respectively applied over a surface area or areas to a first and second film portion of the film, respectively, in order to be connected to the first or second surface region respectively of the optical element.

In a further embodiment, a heat-conducting component that is preferably formed in one piece is arranged between the film and the optical element. Such a heat-conducting component between the film and the optical element makes it possible to distribute a local change in temperature at the optical element, which may be caused for example by the wetting with a drop of liquid or by cold of evaporation on the side of the film that is facing away from the optical element, over a large surface area as a result of the high thermal conductivity of the heat-conducting component, so that the occurrence of excessive local temperature gradients in the optical element and associated aberrations or imaging errors can be avoided.

In one development, the heat-conducting component is formed as a heat-conducting layer, in particular as a metallic layer. In particular if the optical element is used in immersion lithography, the installation space that is available for the mounting of such a component is typically relatively small, so that no components of too great a thickness can be used. The heat-conducting layer may have a thickness which lies for example in a range of values between 0.01 mm and 0.5 mm.

The heat-conducting layer may in particular also be embodied for the absorption of radiation that is transmitted by the optical element. The radiation that is transmitted by the optical element is typically UV radiation with a used or laser wavelength of less than 250 nm. If the heat-conducting layer is absorbent or non-transmissive at least at the used wavelength of the radiation that is transmitted by the optical element, the heat-conducting layer may serve as a radiation-protection layer, which protects the film from (stray) radiation from the optical element, and consequently from the possibly occurring loss of liquid-repellent properties of the hydrophobic material during the exposure to UV radiation.

The heat-conducting layer may in particular be formed as a metal layer or as a metal film. This is advantageous because metallic materials typically have a high thermal conductivity. Moreover, metallic materials typically absorb UV radiation, so that a metallic layer or a metallic film can serve as a radiation-protection layer. It goes without saying that the material of the heat-conducting layer does not necessarily have to be a metal.

In a further development, the (in this case typically one-piece) heat-conducting component extends both into the first surface region and into the second surface region. The heat-conducting component consequently covers the edge between the first and second surface regions, so that a heat conduction or a heat transfer can take place between the first and second surface regions. It is advantageous in principle if the heat-conducting component covers an area that is as large as possible in order to make optimum use of the heat-conducting effect of the component. It is therefore advantageous if the heat-conducting component extends both into the first surface region and into the second surface region. Alternatively, the heat-conducting component may possibly only be mounted in the first surface region, which is formed adjacent to the optically used region of the optical element, or possibly only in the second surface region.

In one development, the heat-conducting component is embedded between a first adhesive layer and a second adhesive layer. As described further above, the first adhesive layer and the second adhesive layer may be respectively formed in the manner of a double-sided adhesive tape, between which the heat-conducting component, in particular the heat-conducting layer, is arranged.

In one development, the heat-conducting component does not extend up to the edge of the film in the first surface region and/or in the second surface region. As described further above, liquid does not penetrate into the intermediate space between the film and the first and second surface regions. In order to achieve this, it may be advantageous if the heat-conducting component, in particular in the form of the heat-conducting layer, does not extend up to the edge of the film, but is at a distance from it of for example more than about 1 mm or about 2 mm. In this way, one or possibly more adhesive layers that seal off the intermediate space between the film and the first and second surface regions at the edges may be arranged between the film and the first and second surface regions in a respective peripheral edge region of the film.

In a further embodiment, the heat-conducting component includes a preferably metallic material with a thermal conductivity of more than 100 W m$^{-1}$ K$^{-1}$. As described further above, the heat-conducting component may be for example a metallic layer of which the thermal conductivity lies in the range specified above. The thermal conductivity of metallic materials is typically less than 500 W m$^{-1}$ K$^{-1}$. The thermal conductivity of the heat-conducting component relates to the operating temperature of the optical assembly, which generally coincides with room temperature (22° C.).

In one embodiment, the film itself is formed as a heat-conducting, preferably metallic component with a thermal conductivity of more than 100 W m$^{-1}$ K$^{-1}$. In this case it is generally possible to dispense with the provision of a heat-conducting component between the film and the first and/or second surface region. Typical hydrophobic materials generally have a comparatively low thermal conductivity, so that they generally do not come into consideration for providing a heat-conducting film. It is therefore advantageous in the embodiment described here if the hydrophobic material is applied to the film in the form of a coating, so that the film itself can be formed from a material that is not hydrophobic, for example a metallic material. As described above, the thermal conductivity of metallic materials is typically less than 500 W m$^{-1}$ K$^{-1}$.

The material with the thermal conductivity of more than 100 W m$^{-1}$ K$^{-1}$ of the heat-conducting component in the form of the film or of the heat-conducting component that is mounted between the film and the first and/or second surface region may be in particular a material that is selected from the group including: Ag, Cu, Au, Al, Mo, brass, Zn, Mg, tungsten, carbon (for example graphite, nanotubes, diamond), SiC, AlN, Si, NiP.

In a further embodiment, the hydrophobic material of the film is selected from the group including: polyolefins, for example polytetrafluoroethylene (PTFE) or polypropylene, polyacrylates, for example (poly)methylmethacrylate, (poly)vinylchlorides, polystyrenes, polysiloxanes, polycarbonates and epoxy polymers. PTFE or Teflon in particular can be easily produced in the form of a film, and is therefore well suited for the present application. It goes without saying that, apart from the hydrophobic material, the film may also include further materials, for example in the form of fibers for increasing the stiffness of the film, etc.

In a further embodiment, the hydrophobic material of the film is applied to the side of the film that is facing away from the first and second surface regions in the form of a coating. In this case, the film itself may consist of a material that is not hydrophobic. In particular, the material of the film may in this case have a high thermal conductivity and serve as a heat-conducting component, as described further above. The film coated with the hydrophobic material may be for example a metal film that is coated with hydrophobic molecules which contain one or more fluoroalkyl groups and/or hydrocarbon groups. Alternatively, colloidal SiO$_2$ nanoparticles or SiO$_2$ soot may be applied to the metal film and provided with a fluorosilane coating. A further possibility for forming the hydrophobic coating is the application of a layer of colloidal silicon with a hydrocarbon layer.

In a further embodiment, the hydrophobic material is roughened or structured on the side of the film that is facing away from the first and second surface regions in order to achieve a higher hydrophobicity. It has been found that the hydrophobic properties of the hydrophobic material can be improved by a structuring or by the creation of a rough surface in the region of the hydrophobic material. In order to achieve this, the film or the hydrophobic material of the film may be subjected to a surface treatment, for example an etching process, a plasma treatment and/or a machining operation, as is also used for increasing the adhesion to the adhesive layer.

In a further embodiment, the film has a thickness of less than 500 μm, preferably of less than 350 μm. As stated further above, the installation space available for the attachment of the film is very limited, in particular in the case of projection exposure apparatuses for immersion lithography. However, the thickness of the film should not be chosen to be too small, i.e. the film should typically have a minimum thickness of more than about 50 μm.

In a further embodiment, a radiation-protection layer is applied to the first surface region and/or to the second surface region of the optical element. The film may possibly be applied directly to the uncoated material of the optical element. It is also possible however to apply the film to the optical element in a coated region, for example to a radiation-protection layer. As described further above, such a radiation-protection layer is absorbent, or ideally non-transmissive, to at least one (laser) wavelength in the UV wavelength range of less than 250 nm. The radiation-protection layer in this way protects both the hydrophobic material and the adhesive layer(s) from degradation through radiation from the interior of the optical element.

The material of the optical element may be synthetic, amorphous or possibly crystalline quartz glass (SiO$_2$). The optical element may also be formed from other materials, for example from barium fluoride (BaF$_2$) or from germanium dioxide (GeO$_2$).

In one embodiment, the first surface region forms a peripheral lateral surface of a conical volume region of the optical element. The formation of a conical volume region on an optical element is advantageous if it is intended to be used for immersion lithography, since the optical element with the conical volume region is generally immersed at least partially into the immersion fluid. The optically used region of the optical element is in this case typically formed by the end face of the conically shaped part of the optical element. The optical element may be for example a lens, but it is also possible that for example a plane-parallel plate has a conical volume region or a conical partial volume, at the end face of which the lens or the plate is immersed into the immersion fluid. The optically used region of the optical element is typically polished, whereas the first and second surface regions are formed on a region of the optical element that is generally matt, i.e. unpolished.

In one embodiment, the second surface region is plane and surrounds the first surface region in an annular manner.

In this case, the peripheral edge is typically formed between the plane surface region and the first surface region, which at least in the region of the edge runs at an angle to the second surface region and may for example form a peripheral lateral surface of a conical part of the optical element (see above). The optical element may in this case be formed for example as a plano-convex lens or as a plane-parallel plate.

The disclosure also relates to an optical assembly, in particular a projection exposure apparatus for immersion lithography, that has at least one optical element as described further above. The optical element is in this case typically arranged in a projection lens of the projection exposure apparatus that serves for projecting an image of a structure onto a light-sensitive substrate. The optical element may be an optical element, for example in the form of a lens, arranged adjacent to the light-sensitive substrate, and consequently to the radiation exit side of the projection lens, that is at least partially wetted by the immersion fluid. For the case where the last optical element is a plane plate with a conical volume region that is completely surrounded by the immersion fluid, at least one further optical element, for example a lens, that is at least partially wetted by the immersion fluid may be provided in the projection lens. This lens or the plane plate may also be formed in the way described further above.

In one embodiment, the optical assembly includes an immersion fluid, in particular water, into which the optical element is immersed at least at an end face. Such a projection exposure apparatus makes the imaging of minute structures possible with high resolution and depth of field.

A further aspect of the disclosure relates to a method for producing an optical element as described further above, including the steps of: providing the optical element, providing the film, and connecting the film to the first surface region and to the second surface region of the optical element.

The film is preferably connected to the first and second surface regions of the optical element by way of an adhesive connection. For this purpose, typically at least one adhesive layer, for example in the manner of a double-sided adhesive tape, which may for example consist of a closed-cell acrylate adhesive (without a foam backing), is typically applied or adhesively attached to the film, and the film provided with the adhesive layer is attached or stuck onto the optical element, to be more precise onto the first and second surface regions.

In one variant, providing the film includes: shaping the film to form a bend in the region of the peripheral edge, and connecting the shaped film to the first surface region and to the second surface region of the optical element. The shaping of the film to form the bend in the region of the peripheral edge may be performed by embossing, by thermoforming, etc. It may also be possible to produce the entire film in a generative layer building process, the bend in the region of the peripheral edge also being shaped or formed in the process of building the film up layer by layer. As described further above, the bend forms a continuous or possibly discontinuous transition between the two film portions that cover the first and second surface regions.

As described further above, a heat-conducting component, in particular a heat-conducting layer, for example in the form of a metal film, may be introduced between the film and the first and/or second surface region. The heat-conducting layer may in particular be embedded between two adhesive layers, and possibly does not extend as far as the edge of the first and/or second surface region. The film may also be formed itself from a heat-conducting, for example metallic, material and be provided with a hydrophobic coating. Such a coating may be applied before or after the shaping of the film to the side of the film that is facing away from the first and second surface regions.

Further features and advantages of the disclosure emerge from the following description of exemplary embodiments of the disclosure, with reference to the figures in the drawing, which show details of the disclosure, and from the claims. The individual features may be realized in each case individually by themselves or as a plurality in any desired combination in a variant of the disclosure.

BRIEF DESCRIPTION OF THE DRAWINGS

Exemplary embodiments are represented in the schematic drawings and are explained in the following description. In the drawings.

DESCRIPTION OF EXEMPLARY EMBODIMENTS

In the following description of the drawings, identical reference signs are used for identical or functionally identical components.

Figure 1:
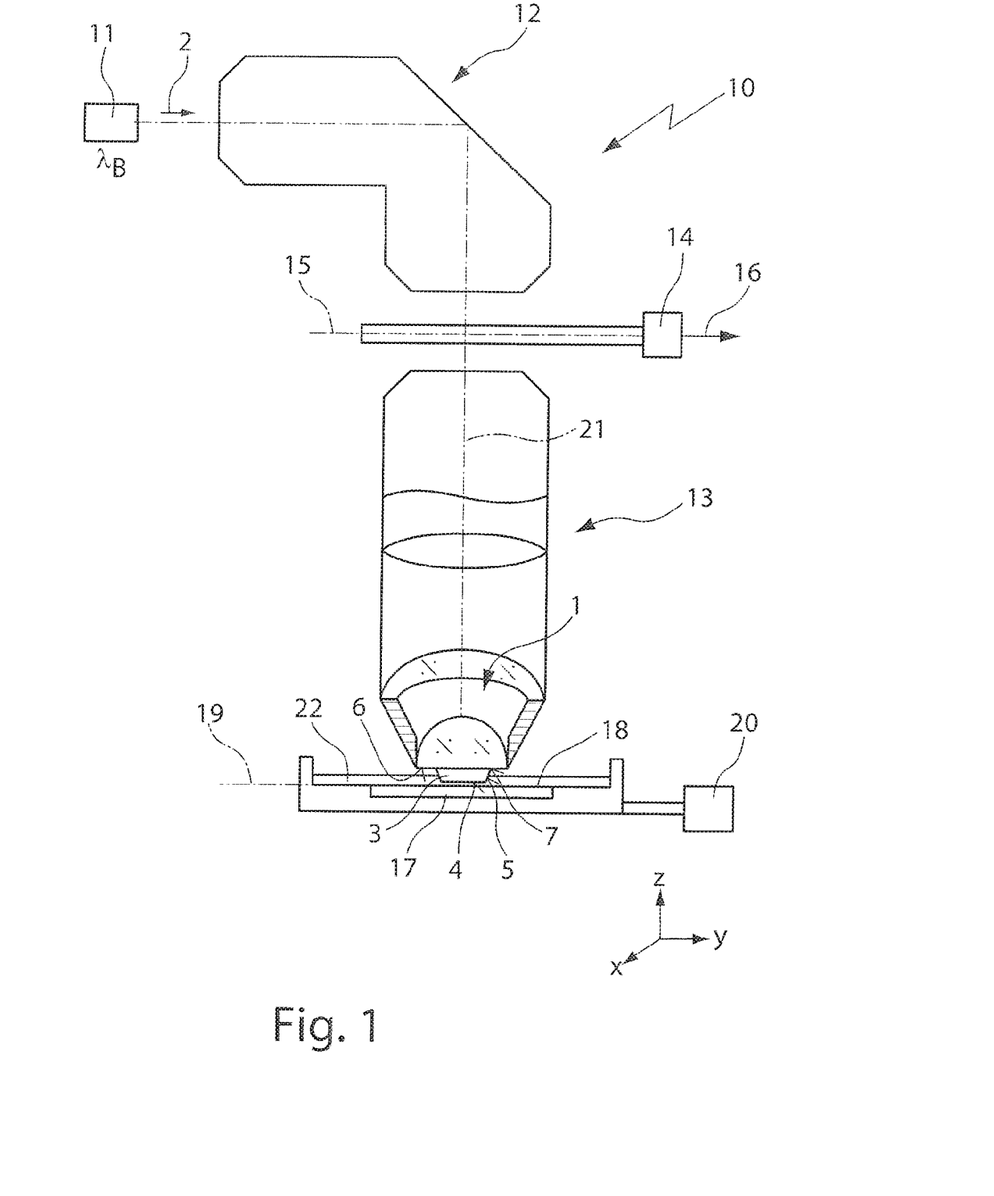
FIG. 1 shows a schematic representation of a projection exposure apparatus for immersion lithography with an optical element in the form of a lens, which has a conical volume region that is partially immersed into an immersion fluid.

In FIG. 1, an optical assembly 10 in the form of a microlithographic projection exposure apparatus, to be more precise in the form of a wafer scanner, for the production of large-scale-integrated semiconductor components is schematically shown. The optical assembly 10 includes as a light source an excimer laser 11 for generating radiation 2 with a used wavelength $\lambda_B$ of 193 nm, other used wavelengths, for example 248 nm, also being possible. A downstream illumination system 12 generates in its exit plane a large, sharply delimited image field adapted to the desired telecentricity properties of a downstream projection lens 13.

A device 14 for holding and manipulating a photomask (not shown) is arranged after the illumination system 12 such that the mask lies in the object plane 15 of the projection lens 13 and is movable in this plane for scanning operation in a traveling direction indicated by an arrow 16.

Following after the plane 15, which is also referred to as the mask plane, is the projection lens 13, which projects an image of the photomask at a reduced scale, for example at a scale of 4:1 or 5:1 or 10:1, onto a wafer 17 coated with a photoresist layer. The wafer 17 used as a light-sensitive substrate is arranged such that the plane substrate surface 18 with the photoresist layer substantially coincides with the image plane 19 of the projection lens 13. The wafer 17 is held by a device 20, which includes a scanner drive, in order to move the wafer 17 synchronously in relation to the photomask and parallel to it. The device 20 also includes manipulators for moving the wafer both in the z direction parallel to an optical axis 21 of the projection lens 13 and in the x and y directions perpendicular to this axis.

The projection lens 13 has as a final element adjacent to the image plane 19 an optical element 1 in the form of a plano-convex lens with a conical volume region 3, the end face 4 of which forms the last optical face of the projection lens 13 and is arranged at a working distance above the substrate surface 18. Arranged between the end face 4 and the substrate surface 18 is an immersion fluid 22, in the present case water, to be more precise ultrapure water, in order to increase the output-side numerical aperture of the projection lens 13. Via the immersion fluid 22, the imaging of structures on the photomask can take place with a higher resolution and depth of field than is possible if the intermediate space between the optical element 1 and the wafer 17 is filled with a medium with a lower refractive index, for example air. The gap that forms the intermediate space is generally between 2 mm and 4 mm.

In the example shown, the lens element 1 consists of synthetic, amorphous quartz glass ($SiO_2$) and has the conical volume region 3 described further above, on the underside of which the end face 4 of the lens element 1 is formed. The radiation 2 produced by the light source 11 passes in a directed manner through the end face of the lens element 1 that forms or delimits an optically used region 4 of the lens element 1. A first surface region 5 in the form of a peripheral lateral surface of the conical lens part 3 surrounds the optically used region 4 and is partially wetted by the immersion fluid 22. The conical, radially inward lens part 3 or the conical lateral surface 5 is adjoined radially outwardly by a plane, second surface region 6. Formed between the conical first surface region 5 and the plane second surface region 6 is an annularly peripheral edge 7, i.e. the first and second surface regions 5, 6 are aligned in relation to one another in the radial direction by an angle which in the example shown is more than about 100°.

The radiation 2 of the light source 11 does not pass in a directed manner through either the first surface region 5 in the form of the lateral surface or the plane second surface region 6, i.e. these two surface regions 5, 6 are outside the beam path of the radiation 2 generated by the light source 11.

Droplets of the immersion fluid 22 may remain on the surface regions 5, 6 of the lens element 1 that are not immersed or only partially immersed in the immersion fluid 22. When these droplets evaporate, there is locally a cooling down of the quartz glass material of the lens element 1, which leads to a local change in the refractive index and also leads to the lens element 1 being deformed locally as a result of the thermal expansion. Both effects can lead to image errors, and are therefore undesired.

In order to prevent local cooling down of the lens element 1 by the evaporating immersion fluid 22, or to minimize the local temperature gradients thereby occurring, a film 8 that includes a hydrophobic material is applied to the lens element 1, as described below on the basis of FIGS. 2A-2D.

Figure 2A:
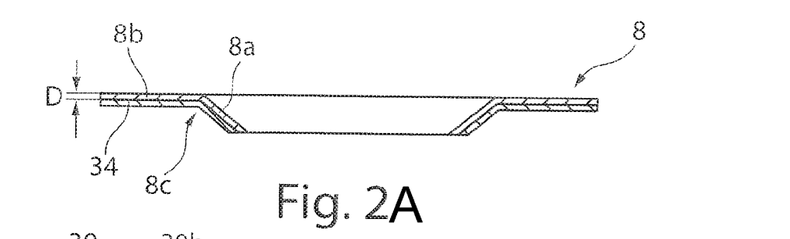
FIGS. 2A-2D show schematic representations of a number of process steps in the production of an optical element according to FIG. 1 that includes a film with a hydrophobic material.

Shown in FIG. 2A is a one-piece film 8 with a three-dimensional geometry which is adapted to the geometry of the optical element 1, to be more precise to the geometry of the first and second surface regions 5, 6. In the example shown, only on its side facing the immersion fluid 22 is the film 8 formed from a hydrophobic material, which has been applied to the film 8 in the form of a coating 34. The coating 34 may be applied to the film 8 before or possibly after the preforming. In the example shown, the film 8 consists of a metallic material, for example of silver, and consequently serves at the same time as a heat-conducting component. In the example shown, the film 8 has a typically constant thickness D, which is less than 500 µm, preferably less than 350 µm, and generally does not go below a thickness D of 50 µm.

The coating 34 of the hydrophobic material may for example contain hydrophobic molecules with fluoroalkyl groups and/or hydrocarbon groups. The application of colloidal $SiO_2$ nanoparticles or $SiO_2$ soot provided with a fluorosilane coating is also possible to form the hydrophobic material. Alternatively, a layer of colloidal silicon may be provided with a hydrocarbon layer in order to form the hydrophobic coating 34. It goes without saying that the hydrophobic coating 34 of the film 8 may also be formed in a way other than that described here.

In the example shown in FIG. 2A, the film 8 is preformed, i.e. it has a first, conical film portion 8a and a second, plane film portion 8b, between which there is formed a bend 8c or a rounding, which forms a continuous transition between the film portions 8a, 8b. If appropriate, the transition between the film portions 8a, 8b may also take place discontinuously, i.e. the bend 8c forms a kink. The preformed film 8 may for example be produced by embossing or thermoforming an annular or circular plane film that is suitably cut to shape. If appropriate, the three-dimensionally shaped film 8 may be produced in a generative layer building process, for example via a 3D printer. The preforming of the film 8 facilitates the application of the film 8 to the first and second surface regions 5, 6 of the optical element 1.

Figure 2B:
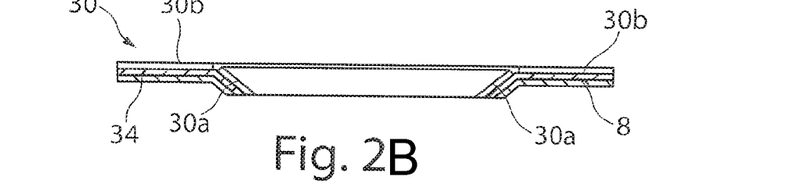

FIG. 2B shows the preformed film 8, to which an adhesive layer 30 in the form of an adhesive tape has been applied. In the example shown, the adhesive layer 30 has a first adhesive layer portion 30a, which has been applied to the conical film portion 8a in order to connect the film 8 to the first surface region 5. A second adhesive layer portion 30b has been applied to the plane, annular film portion 8b of the film 8 and serves for connecting the film 8 to the second, plane surface region 6 of the optical element 1. In the example shown, the adhesive layer 30 is formed in two parts, so that the region of the bend 8c is not provided with an adhesive layer 30. The desire for the adhesive layer 30 to be preformed, as is the case with the film 8, can be avoided by the use of two adhesive layer portions 30a, 30b.

It may be possible to dispense with the provision of the first adhesive layer portion 30a, i.e. the film 8 is only connected to the second, plane surface region 6 of the optical element 1 by way of the second adhesive layer portion 30b. In this case, the immersion fluid 22 can penetrate into the gap formed between the first surface region 5 and the film 8, which however has virtually no effects on the imaging quality of the optical element 1 as a result of the heat-conducting properties of the film 8 shown in FIGS. 2A, 2B, which brings about a homogenization of the temperature in the region of the gap.

Figure 2C:
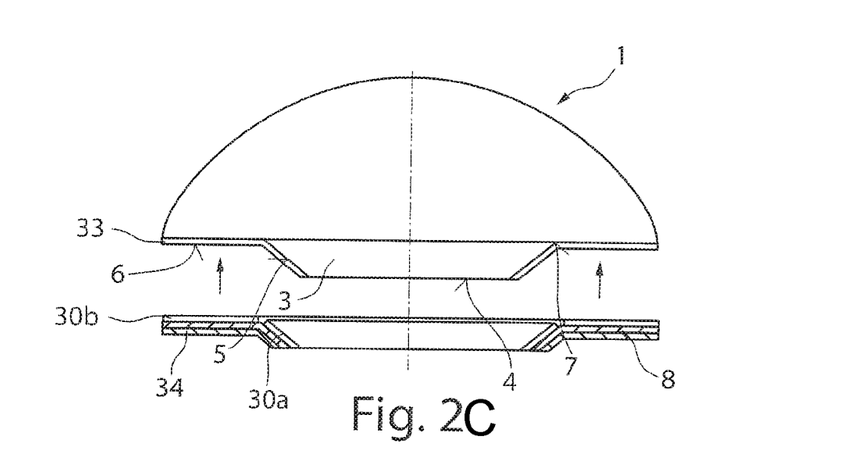

FIG. 2C shows the film 8 from FIG. 2B during the attachment to the optical element 1. Applied to the optical element 1 in the first and second surface regions 5, 6 is a radiation-protection layer 33, which consists of a material that has absorbent properties at wavelengths of less than 250 nm, in particular at the used wavelength 4, or is substantially non-transmissive to radiation at these wavelengths. An oxidic material may serve for example as the radiation-protection layer 33, for example titanium dioxide ($TiO_2$), tantalum pentoxide ($Ta_2O_5$), hafnium dioxide ($HfO_2$), zirconium dioxide ($ZrO_2$) etc.

Figure 2D:
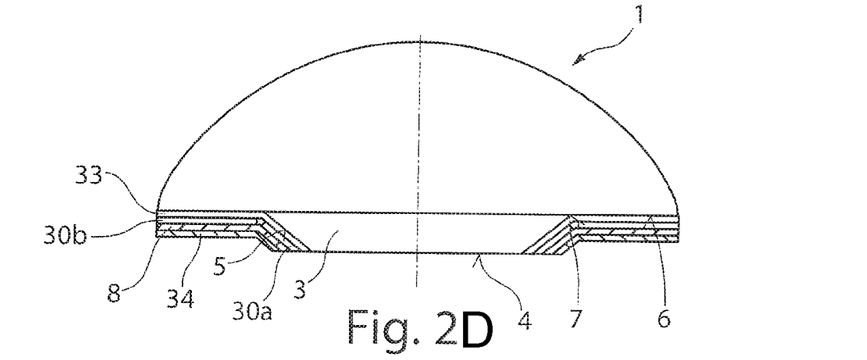

As can be seen in FIG. 2C, the first adhesive layer portion 30a on the conical film portion 8a of the preformed film 8 is connected to the first, conical surface region 5 of the optical element 1. Correspondingly, the second adhesive layer portion 30b on the plane film portion 8b is connected to the second, plane surface region 6 of the optical element 1. For this purpose, the film 8 is placed onto the first and second surface regions 5, 6 of the optical element 1, as indicated in FIG. 2C by arrows. FIG. 2D shows the optical element 1 after the completion of the connection process. Since the first and second adhesive layer portions 30a, 30b in each case run around in an annular manner, no immersion fluid 22 can penetrate into the intermediate space between the film 8 and the first and second surface regions 5, 6.

Shown in FIGS. 3A-3D is a method for producing an optical element 1 that differs from the method described in conjunction with FIGS. 2A-2D firstly in that the film 8 itself consists of a hydrophobic material, to be precise in the example shown of PTFE. It goes without saying that other hydrophobic materials that can be produced in the form of a film 8 can also be used, for example other polyolefins, for example polypropylene, polyacrylates, for example (poly)methylmethacrylate, (poly)vinylchlorides, polystyrenes, polysiloxanes, polycarbonates, epoxy polymers, etc.

Figure 3A:
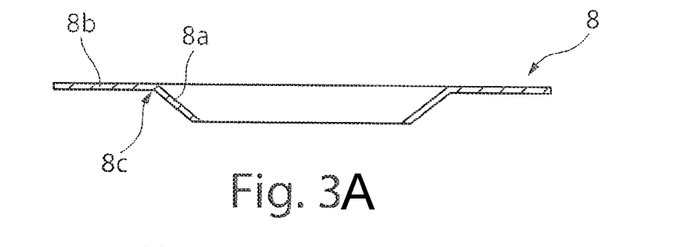
FIGS. 3A-3D show schematic representations of a number of process steps analogous to FIGS. 2A-2D, in which a heat-conducting layer is introduced between the film and a first and second surface region of the optical element.
Figure 3B:
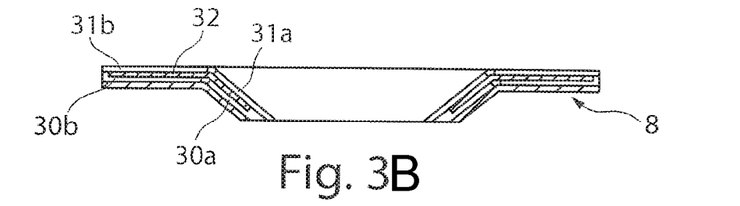
Figure 3C:
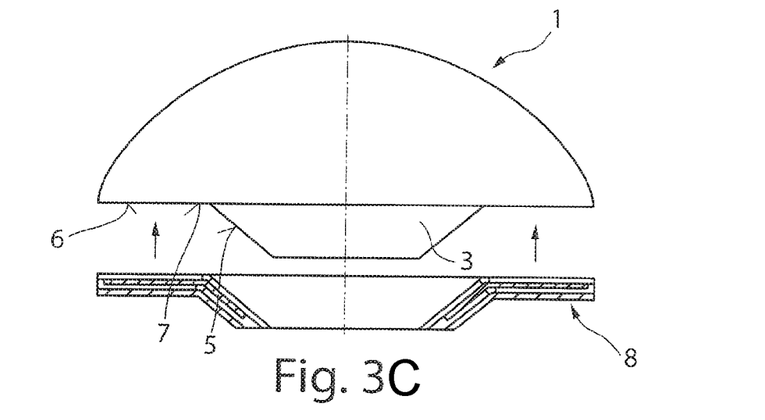
Figure 3D:
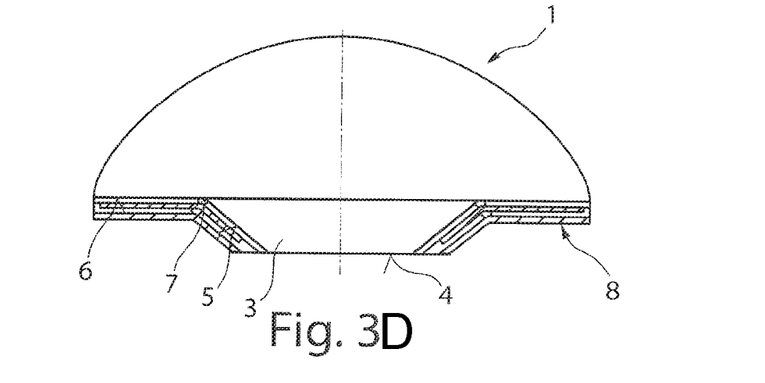

In the example shown in FIGS. 3A-3D, a heat-conducting component in the form of a heat-conducting metallic layer 32 has been introduced between the preformed film 8 and the first and second surface regions 5, 6. As can be seen in FIG. 3B, for this purpose the metallic layer 32 is placed onto a first adhesive layer 30, which as in FIG. 2B has a first and second adhesive layer portion 30a, 30b. A second adhesive layer 31, which likewise has a first adhesive layer portion 31a and a second adhesive layer portion 31b, covers the heat-conducting layer 32, so that the latter is embedded between the first and second adhesive layers 30, 31.

To improve the adhesion of the film 8 to the first adhesive layer 30, it may be desired or advantageous to subject the hydrophobic material of the film 8 to a surface treatment, for example an etching process, a plasma treatment and/or a machining operation. The hydrophobic material of the film 8 may alternatively or additionally also be structured and/or roughened on the side facing the immersion fluid 22, in order to increase its hydrophobicity. For this purpose, the film 8 may be subjected to a surface treatment on the side facing the immersion fluid 22, for example an etching process, a plasma treatment and/or a machining operation. It goes without saying that such a treatment may also be carried out on the film 8 described in FIGS. 2A-2D, to be more precise on its hydrophobic coating 34.

As can likewise be seen in FIG. 2B, the metallic layer 32 is formed as one part and extends both into the first surface region 5 and into the second surface region 6 of the optical element 1, i.e. the heat-conducting layer 32 covers the bend 8c of the film 8 or the edge 7 between the first and second surface regions 5, 6. In this way, the heat-conducting layer 32 can produce a heat transfer between the first and second surface regions 5, 6. Suitable as materials for the heat-conducting layer 32 are in particular metals that have a high thermal conductivity of for example more than 100 W m$^{-1}$ K$^{-1}$, for example silver, which has a thermal conductivity of 429 W m$^{-1}$ K$^{-1}$, but also other metals, such as for example Ag, Cu, Au, Al, Mo, Zn, Mg, tungsten, alloys such as for example brass and also nonmetallic materials such as carbon (for example graphite, nanotubes, diamond), SiC, AlN, Si, NiP, . . . . The heat-conducting layer 32 may be formed in one piece, without having to be preformed for this purpose, since the heat-conducting layer 32 is applied to the first adhesive layer 30. The heat-conducting layer 32 may alternatively be preformed before it is applied to the first adhesive layer 30.

As can be seen in particular in FIG. 3B, the heat-conducting layer 32 extends neither up to the inner edge of the first surface region 5, or up to the inner edge of the film 8, nor up to the outer edge of the second surface region 6, or up to the outer edge of the film 8, but is at a distance from it of more than about 1 mm or more than about 2 mm. In this way the immersion fluid 22 can be prevented from being able to penetrate into the region between the film 8 and the first and second surface regions 5, 6. If appropriate, the heat-conducting layer 32 may also extend up to the edge of the first and/or second surface region 5, 6, as long as sufficient impermeability of the connection between the film 8 and the first and/or second surface region 5, 6 is ensured.

Unlike the situation shown in FIGS. 2A-2D and in FIGS. 3A-3D, the film 8 may cover not only the second surface region 6 of the optical element 1 but possibly also further components, for example a mount or the like, on which the optical element 1 is fastened in the projection lens 13. In this case the film 8, to be more precise its plane surface region 8b, has a diameter that is greater than the diameter of the optical element 1 or the diameter of the second, plane surface region 6. If appropriate, the second surface region 6 may be adapted in the portion projecting over the optical element 1 to the geometry of components that are present there, in that in this portion the film 8 is preformed or suitably cut to shape.

It goes without saying that optical elements for immersion lithography do not necessarily have to have the plano-convex geometry described further above; however, a conically shaped volume region 3 is typical for such optical elements. In particular instead of amorphous quartz glass, the optical element 1 or its main body may consist of some other material that is transparent above a wavelength of about 250 nm or about 193 nm, for example of crystalline quartz glass (SiO$_2$), barium fluoride (BaF$_2$) or germanium dioxide (GeO$_2$).

What is claimed is:

1. A method, comprising:
    forming a one-piece film; and
    after forming the one-piece film, connecting the one-piece film to: i) a first surface region of the optical element; and ii) a second surface region of the optical element, wherein:
        the first surface region surrounds the optically used region;
        the second surface region adjoins the first surface region so that a peripheral edge is present between the first and second surface regions;
        the one-piece film comprises a hydrophobic material at least on a side of the one-piece film facing away from the first and second surface regions; and
        the method further comprises disposing an adhesive layer between the optical element and the one-piece film so that the adhesive layer connects the one-piece film to the first and second surface regions of the optical element.

2. The method of claim 1, further comprising:
    forming a bend in the one-piece film in a region of the peripheral edge; and
    after forming the bend, connecting the one-piece film to the first and second regions of the optical element.

3. The method of claim 1, wherein the adhesive layer comprises an adhesive tape.

4. The method of claim 3, wherein:
    the adhesive layer comprises first and second portions;
    the first portion of the adhesive layer connects the one-piece film to the first surface region; and the second portion of the adhesive layer connects the one-piece film to the second surface region.

5. The method of claim 1, further comprising disposing a heat-conducting component between the one-piece film and at least one region selected from the group consisting of the first surface region and the second surface region.

6. The method of claim 5, wherein the heat-conducting component comprises a heat-conducting layer.

7. The method of claim 5, wherein the heat-conducting component extends into the first and second surface regions.

8. The method of claim 5, further comprising embedding the heat-conducting component between first and second adhesive layers.

9. The method of claim 5, wherein the heat-conducting component does not extend to an edge of the one-piece film in at least one region selected from the group consisting of the first surface region and the second surface region.

10. The method of claim 5, wherein the heat-conducting component comprises a material having a thermal conductivity greater than 100 W $m^{-1}$ $K^{-1}$.

11. The method of claim 1, wherein the one-piece film has a thermal conductivity of more than 100 W $m^{-1}$ $K^{-1}$.

12. The method of claim 1, wherein the hydrophobic material of the one-piece film comprises at least one material selected from the group consisting of polyolefins, polyacrylates, (poly)vinylchlorides, polystyrenes, polysiloxanes, polycarbonates and epoxy polymers.

13. The method of claim 1, wherein the hydrophobic material is roughened on the side of the one-piece film that faces away from the first and second surface regions.

14. The method of claim 1, wherein the hydrophobic material comprises a coating on the side of the one-piece film facing away from the first and second surface regions.

15. The method of claim 1, wherein the one-piece film has a thickness of less than 500 μm.

16. The method of claim 1, further comprising disposing a radiation-protection layer on at least one region selected from the group consisting of the first surface region and the second surface region.

17. The method of claim 1, wherein the first surface region defines a peripheral lateral surface of a conical volume region of the optical element.

18. The method of claim 17, wherein the second surface region is planar and surrounds the first surface region in an annular manner.

19. The method of claim 1, wherein the second surface region is planar and surrounds the first surface region in an annular manner.

20. The method of claim 1, wherein the method forms an article, and the method further comprises incorporating into an immersion lithography projection exposure apparatus.

21. The method of claim 20, an end face of the article is at least partially immersed in an immersion fluid in the immersion lithography projection exposure apparatus.

* * * * *

UNITED STATES PATENT AND TRADEMARK OFFICE
CERTIFICATE OF CORRECTION

PATENT NO. : 10,520,826 B2
APPLICATION NO. : 16/223624
DATED : December 31, 2019
INVENTOR(S) : Roland Pilz and Thomas Petasch

Page 1 of 1

It is certified that error appears in the above-identified patent and that said Letters Patent is hereby corrected as shown below:

In the Specification

Column 10, Line 58, delete "4," and insert -- $\lambda_B$, --.

Signed and Sealed this
Fifth Day of May, 2020

Andrei Iancu
*Director of the United States Patent and Trademark Office*